United States Patent
Bono et al.

(10) Patent No.: US 9,608,037 B2
(45) Date of Patent: Mar. 28, 2017

(54) MESA STRUCTURE DIODE WITH APPROXIMATELY PLANE CONTACT SURFACE

(71) Applicant: Commissariat a L'Energie Atomique et aux Energies Alternatives, Paris (FR)

(72) Inventors: Hubert Bono, Grenoble (FR); Ivan-Christophe Robin, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/748,707

(22) Filed: Jun. 24, 2015

(65) Prior Publication Data

US 2015/0380459 A1 Dec. 31, 2015

(30) Foreign Application Priority Data

Jun. 27, 2014 (FR) ...................................... 14 56085

(51) Int. Cl.
*H01L 27/15* (2006.01)
*H01L 33/38* (2010.01)
*H01L 27/102* (2006.01)
*H01L 31/02* (2006.01)
*H01L 31/0224* (2006.01)
*H01L 27/144* (2006.01)
*H01L 31/0352* (2006.01)
*H01L 31/18* (2006.01)
(Continued)

(52) U.S. Cl.
CPC .......... *H01L 27/15* (2013.01); *H01L 27/1021* (2013.01); *H01L 27/1443* (2013.01);
(Continued)

(58) Field of Classification Search
CPC ..................................................... H01L 33/385
See application file for complete search history.

(56) References Cited

U.S. PATENT DOCUMENTS 5,952,681 A 9/1999 Chen
6,547,249 B2 * 4/2003 Collins, III ........... H01L 27/153
257/88
(Continued)

FOREIGN PATENT DOCUMENTS

FR 2 992 465 A1 12/2013
WO WO 2010/093190 A2 8/2010

OTHER PUBLICATIONS

French Preliminary Search Report issued Mar. 3, 2015 in French Application 14 56085, filed on Jun. 27, 2014 (with English Translation of Categories of Cited Documents).

*Primary Examiner* — Stephen W Smoot
(74) *Attorney, Agent, or Firm* — Oblon, McClelland, Maier & Neustadt, L.L.P.

(57) ABSTRACT

There is provided an electronic device including at least two diodes each having a mesa structure, including: a first and a second doped semiconductor portion forming a p-n junction, such that a first part of the second doped semiconductor portion located between a second part of the second doped semiconductor portion and the first doped semiconductor portion forms an offset from the second part; a first electrode electrically connected to the first portion, and a second electrode electrically connected to the second portion at an upper face of the second part; and dielectric portions covering side faces of the first portion, the second portion, and the first electrode, wherein upper faces of the first electrode, the second electrode, and the dielectric portions form an approximately plane continuous surface.

10 Claims, 7 Drawing Sheets

(51) Int. Cl.
- *H01L 33/00* (2010.01)
- *H01L 33/06* (2010.01)
- *H01L 33/20* (2010.01)
- *H01L 33/62* (2010.01)

(52) U.S. Cl.
CPC ........ *H01L 27/1446* (2013.01); *H01L 27/156* (2013.01); *H01L 31/02005* (2013.01); *H01L 31/022416* (2013.01); *H01L 31/035236* (2013.01); *H01L 31/18* (2013.01); *H01L 33/005* (2013.01); *H01L 33/06* (2013.01); *H01L 33/385* (2013.01); *H01L 33/387* (2013.01); *H01L 33/20* (2013.01); *H01L 33/62* (2013.01); *H01L 2933/0016* (2013.01)

(56) References Cited

U.S. PATENT DOCUMENTS

| | | | |
|---|---|---|---|
| 6,957,899 B2 | 10/2005 | Jiang et al. | |
| 7,141,825 B2* | 11/2006 | Horio | H01L 33/40 257/79 |
| 7,213,942 B2* | 5/2007 | Jiang | H05B 33/0821 257/88 |
| 7,221,044 B2 | 5/2007 | Fan et al. | |
| 7,939,849 B2* | 5/2011 | Yoo | H01L 33/32 257/103 |
| 8,272,757 B1 | 9/2012 | Fan et al. | |
| 8,283,682 B2* | 10/2012 | Yoon | H01L 27/156 257/92 |
| 8,450,748 B2* | 5/2013 | Su | H05B 33/0803 257/76 |
| 2011/0284910 A1* | 11/2011 | Iduka | H01L 33/385 257/99 |
| 2013/0105825 A1 | 5/2013 | Liu et al. | |
| 2014/0097401 A1 | 4/2014 | Robin | |
| 2014/0120702 A1 | 5/2014 | Vaufrey et al. | |
| 2014/0159063 A1 | 6/2014 | Odnoblyudov et al. | |
| 2014/0159071 A1* | 6/2014 | Choi | H01L 27/15 257/88 |
| 2015/0060904 A1 | 3/2015 | Robin et al. | |
| 2016/0049546 A1* | 2/2016 | Hwang | H01L 33/385 257/13 |

* cited by examiner

MESA STRUCTURE DIODE WITH APPROXIMATELY PLANE CONTACT SURFACE

TECHNICAL DOMAIN AND PRIOR ART

The invention relates to the domain of diodes, advantageously photo-emitting diodes such as light emitting diodes (LEDs or micro-LEDs) and devices such as light fittings or lighting devices comprising LEDs, including LED bulbs, LED lights, signaling devices, LED spot lights, smart lighting, etc. The invention is also applicable to the domain of photo-receiving diodes such as photodiodes and devices such as detection devices or sensors comprising photodiodes.

A lighting device with LEDs such a LED bulb usually uses an electrical power supply device called a driver that adapts an initial voltage, for example the mains power voltage, to the operating voltage of the lighting device. Such an adaptation is necessary because the operating voltage of a LED is usually a few volts, for example about 3V, while the peak voltage of the mains power supply may for example be 320V in the case of a power supply by 230V alternating voltage.

However, these drivers are the cause of more than half of all causes of failure of LED lighting devices. Another problem that is not conducive to the use of LEDs with a high current density is management of heat and evacuation of heat generated by operation of the LEDs that is essential in this case.

LEDs can be put in series within the lighting device to obtain an operating voltage for this set of LEDs connected in series, higher than the operating voltage of a single LED because the operating voltage of this set of LEDs is equal to the sum of the individual operating voltages of these LEDs. By increasing the value of the operating voltage of the lighting device, the reliability of the driver used is improved because the architecture of such a driver does not require the use of high capacitances and converters of such high values as when the operating voltage of the device is equivalent to the voltage of a single LED.

Proposed technologies for putting LEDs in series or more generally for making electrical interconnections of several LEDs are based on standard processes commonly used in so-called planar technology; each basic brick is defined by a deposition step and then a lithography step followed by an etching step. Thus, with this type of process, each pattern in a material requires the implementation of three steps. Furthermore, each pattern made must be aligned with the previous patterns. As a result, the definition of the pattern must take account of the performances of equipment concerned both in terms of achievable dimensions and alignment performances relative to the previous pattern. The result is a significant loss of emission surface area.

For example, document U.S. Pat. No. 6,957,899 B2 discloses how LEDs are put into series through making electrical connections by deposition, lithography and etching. Therefore, the problems described above occur when making electrical connections. Furthermore with this type of structure, the electrical insulation between LED electrodes by making insulation layers deposited in accordance with the patterns of the structure causes a significant loss of the available active surface area relative to the total available surface area.

Documents U.S. Pat. No. 7,221,044 B2 and U.S. Pat. No. 8,272,757 B1 disclose how to put LEDs in series by hybridizing LEDs on a substrate on which electrical interconnections are made, hybridization being made by meltable microballs. Such hybridization is difficult to apply due to the irregular structure of the LEDs. Furthermore, the electrical interconnection of LEDs through a substrate on which the LEDs are hybridized by microballs also has the disadvantage that it increases the series electrical resistance of the assembly and therefore generates electrical losses due to the transport of charges through the substrate and microballs.

In document U.S. Pat. No. 2013/0105825 A1, electrical connections between LEDs are made by wires or connection elements made on the LEDs. However, the techniques used in this document to make these connecting wires or elements are difficult to apply for an industrial application.

PRESENTATION OF THE INVENTION

Thus there is a need to propose a diode for which the architecture facilitates its electrical connection, particularly when it is put in series with other diodes with a similar architecture adapted to be integrated at high density with other similar diodes within an electronic device, facilitating hybridization on it, avoiding the manufacturing of wires or connection elements as in prior art and guaranteeing good electrical insulation between the diode electrodes.

This is done by proposing a diode or micro-diode with a mesa structure comprising at least:
first and second doped semiconductor portions forming a p-n junction, such that a first part of the second doped semiconductor portion located between a second part of the second doped semiconductor portion and the first doped semiconductor portion forms an offset or a recess from the second part of the second doped semiconductor portion,
a first electrode electrically connected to the first doped semiconductor portion, and a second electrode electrically connected to the second doped semiconductor portion at an upper face of the second part of the second doped semiconductor portion,
dielectric portions covering the side faces of the first doped semiconductor portion, the second doped semiconductor portion and the first electrode,
and in which the upper faces of the first electrode, the second electrode and dielectric portions form an approximately plane continuous surface.

Another embodiment concerns an electronic or microelectronic device comprising at least two mesa structure diodes, each diode comprising at least:
first and second portions of doped semiconductor forming a p-n junction such that a first part of the second doped semiconductor portion arranged between a second part of the second doped semiconductor portion and the first doped semiconductor portion forms an offset or a recess from the second part of the second doped semiconductor portion, on only one side of the mesa structure,
a first electrode electrically connected to the first doped semiconductor portion, and a second electrode electrically connected to the second doped semiconductor portion at an upper face of the second part of the second doped semiconductor portion,
dielectric portions covering the side faces of the first doped semiconductor portion, of the second doped semiconductor portion and the first electrode, such that dielectric portions at the sides of the mesa structure that do not form an offset or a recess are continuous along the entire height of the mesa structure, in which the upper faces of the first electrode, the second electrode and the dielectric portions form an approximately plane continuous surface, and in which:

the diodes are electrically connected in series such that the first electrode of one of the two diodes is electrically connected to the second electrode of the other of the two diodes, the second electrode of said other of the two diodes is in contact with one of the dielectric portions of said one of the two diodes covering one of the sides of the mesa structure that does not form the offset or the recess.

Thus, unlike diode structures according to prior art in which the dielectric layers are successively deposited on the entire structure to achieve electrical insulation of the electrodes from the diodes, this diode makes use of dielectric portions, or electrical insulation portions covering the side faces of the elements forming the mesa structure of the diode so that the side faces of the p-n junction of the diode can be electrically insulated and passivated, particularly with respect to the second electrode, and/or the portions of doped semiconductor in the p-n junction facing each other can be electrically insulated when they are not directly in contact with each other. These dielectric portions can also be used to form electrical insulation between the first and second electrodes while occupying a minimum amount of space on the surface occupied by the diode. This positioning of the dielectric portions on the side faces of the mesa structure of the diode can improve the ratio between the active surface area of the diode (area occupied by the p-n junction) and the total area on which the diode is made, and therefore increase the integration of this type of diode considering the small size of the dielectric portions of this structure that are strictly vertical (parallel to the side faces of the mesa structure of the diode that are covered by these dielectric portions).

Furthermore, this strong integration of dielectric portions also has the advantage that it minimizes the current densities obtained in the electrodes of the diode, and therefore reduces heating generated in the diode by the Joule effect.

The expression "mesa structure" denotes the fact that the diode is made in the form of a stack of the first and second portions of doped semiconductor, a junction zone being present between these two doped semiconductor portions and that this stack is etched over at least part of its height in the form of an island called a mesa. Furthermore, this island also comprises a recess at the second doped semiconductor portion forming an electrical contact zone on the second doped semiconductor portion for the second electrode.

The offset or recess is formed by the first part of the second doped semiconductor portion relative to the second part of the second portion of doped semiconductor on at least one side of the mesa structure. This offset is also formed by the first electrode relative to the second part of the second doped semiconductor portion. Similarly, the second part of the second doped semiconductor portion forms a projection, or projecting part, relative to the first electrode and the first part of the second doped semiconductor portion, at least on one side of the mesa structure.

The approximately plane continuous surface formed by the upper faces of the electrodes and the dielectric portions makes it easy to hybridize the diode to another element such as a substrate, for example without using inserts such as connection microballs, to make different diode connection configurations and also possibly comprising a plane face on which materials similar to the diode materials are located, for example by direct metal to metal bonding (for electrodes) and dielectric to dielectric bonding (for dielectric portions). This approximately plane continuous surface is also very suitable for making an interconnection structure directly on the electrodes thus avoiding many difficulties related to the residual topology of diode structures according to prior art.

The upper faces of the first electrode, the second electrode and dielectric portions form an approximately plane continuous surface, in other words they are located in approximately the same plane. The expression "approximately plane" is used herein to denote the fact that the surface formed by the upper faces of the electrodes and the dielectric portions may have height or thickness variations between about 0 and 150 nm. These slight height or thickness variations may originate in application of a chemical mechanical planarization (CMP) used in the presence of electrode materials and dielectric portions, the etching rates of these different materials being different from each other. These slight height or thickness variations between the upper faces of the dielectric portions and of electrodes can have the advantage of guaranteeing excellent insulation between electrodes of the diode and/or from electrodes of adjacent diodes when there are hollows at the upper faces of electrodes.

The connection in series between diodes may be formed on the upper faces of the diode electrodes.

In the electronic device, the shape of the mesa structure of diodes (mesa structure with an offset or recess on one side only) naturally confer electrical insulation between two adjacent diodes, not requiring manufacturing of an additional insulation element between the second electrodes of two adjacent diodes connected to each other in series, due to the fact that since the sides of the mesa structure do not form an offset, the dielectric portions are continuous along the entire height of the mesa structure and therefore electrically insulate this mesa structure from the second electrode of the adjacent diode. Thus, the diodes can easily be put in series with each other without the need to add insulating structures between the diodes.

The first electrode, the first doped semiconductor portion, the first part of the second doped semiconductor portion and the second part of the second doped semiconductor portion of each diode may each have a section in a plane parallel to an interface between the first and second parts of the second doped semiconductor portion with a rectangular shape. The interface between the first and second parts of the second semiconductor portion may be parallel to the approximately plane continuous surface.

In this case, for each diode, a dimension of one side of the section of the second part of the second doped semiconductor portion may be greater than a dimension of the section of the first part of the second doped semiconductor portion parallel to said side of the section of the second part of the second doped semiconductor portion. Thus, the offset or recess may be formed at one side of the mesa structure of the diode. Such a mesa structure may be "L" shaped. This can also be applicable for sections with shapes other than rectangular.

The dielectric portions may cover only the side faces of the mesa structure thus guaranteeing a minimum dimension of dielectric portions on the total area occupied by the diode and optimizing heat transport due to a global reduction in the thermal resistance of the diode.

The first semiconductor portion may be p doped and the second semiconductor portion may be n doped, the first electrode possibly forming an anode of the diode and the second electrode possibly forming a cathode of the diode.

Each diode may be a photodiode or a light emitting diode.

In this case, the photodiode may comprise at least one portion of intrinsic semiconductor arranged between the first and second doped semiconductor portions such that the side faces of the intrinsic semiconductor portion are covered by the dielectric portions, or in which the LED comprises at least one active emission zone with at least one quantum well arranged between the first and the second doped semiconductor portions and such that the side faces of the active emission zone are covered by the dielectric portions.

The upper faces of the first electrodes, the second electrodes and the dielectric portions of said diodes together form the approximately plane continuous surface.

The electronic device may advantageously form a module of LEDs powered with a direct or alternating voltage with a value between approximately the value of the operating voltage of one of the LEDs, for example about 3V, and a value corresponding to the sum of the operating voltages of several LEDs, for example between 6V and several hundred volts, or between about 6V and 50V. The type (direct or alternating) and the value of the power supply voltage of the electronic device may depend on the number of LEDs included in the electronic device and electrical connections connecting the LEDs to each other (regardless of whether or not they are in series). The electronic device may be adapted to be powered at high voltage, in other words for example with a voltage with a value equal to at least 100V.

Each of the second electrodes may be in contact with at least one of the dielectric portions of an adjacent diode. Integration of diodes is thus maximized within the electronic device because the second electrodes may fill a space between two adjacent diodes.

The electronic device may also comprise a diode connection structure located on the upper faces of the first electrodes, second electrodes or dielectric portions, the connection structure possibly comprising at least electrically conducting elements electrically connected to the first and/or second electrodes of diodes and electrically insulated from each other by dielectric elements. Thus, the routing and interconnections may be made directly on the diode electrodes, in the connection structure, avoiding the use of another routing structure added onto the diodes and limiting electrical losses generated by the transport of charges through this routing substrate, which also helps to optimize integration of the device and limit temperature rises due to losses by the Joule effect.

The value of the operating voltage of the electronic device may be modulated depending on the electrical connections of the diodes made within the connection structure. Electrical connections of diodes may be adapted to form an electronic device that will be powered by a direct or alternating voltage, or they may make diodes redundant by connecting diodes in parallel such that failure of one of the diodes will not cause an open circuit and a global failure of the electronic device.

An upper face of the connection structure may form a continuous plane surface. It is thus possible and easy to add or hybridize a circuit or a substrate onto the connection structure, for example by direct bonding.

At least some of the diodes may be electrically connected to each other in series by at least some of the electrically conducting elements of the connection structure, each of said electrically conducting elements electrically connecting a second electrode of one of said diodes to a first electrode of the other of said diodes. Putting diodes in series in this way advantageously forms a module of LEDs powered by a direct or alternating voltage with a value higher than the operating voltage of one of the LEDs. Such a structure also means that the device only needs two interconnection pads with the outside environment formed by two of the electrically conducting elements (for example with a contact area of the order of one $mm^2$) of the connection structure, and thus relax constraints related to the application of aligned bonding of a driver with the connection structure.

Such a structure can also give a large reduction in the response time of the electronic device by reducing apparent capacitances and resistances for PWM (pulse wave modulation) power supplies, for example when the electronic device is designed to make a Li-Fi type data transmission.

Each electrically conducting element in the connection structure may form a connection pad electrically connected to a single electrode of one of the diodes, the electronic device possibly comprising also a substrate hybridized onto the connection structure and comprising means capable of forming electrical connections between the electrically conducting elements of the connection structure. In this case, individual addressing of each of the electrodes of the diodes can be made through the hybridized substrate and means capable of forming electrical connections. Furthermore, this configuration also makes it possible to define the distance between electrically conducting elements of the connection structure with a great deal of freedom, this distance possibly being greater than the thickness of the dielectric portions separating two electrodes of a diode.

A method of manufacturing a mesa structure diode is also disclosed, comprising at least the following steps:
  make a stack of layers comprising at least one first layer of doped semiconductor arranged between a second layer of doped semiconductor and an electrically conducting layer,
  etch the stack of layers, making first and second doped semiconductor portions forming a p-n junction, the second doped semiconductor portion comprising a first part located between a second part of the second doped semiconductor portion and the first doped semiconductor portion forming an offset from the second part of the second doped semiconductor portion, and making a first electrode electrically connected to the first doped semiconductor portion,
  make dielectric portions covering the side faces of the first doped semiconductor portion, the second doped semiconductor portion and the first electrode,
  deposit at least one electrically conducting material in contact with the upper face of the second part of the second doped semiconductor portion,
  planarization of the electrically conducting material stopping on the first electrode or on upper faces of the dielectric portions, forming a second electrode electrically connected to the second doped semiconductor portion and such that the upper faces of the first electrode, the second electrode and the dielectric portions form an approximately plane continuous surface.

Another embodiment discloses a method of making an electronic device comprising at least two mesa structure diodes, comprising at least the following steps:
  make a stack of layers comprising at least a first doped semiconductor layer located between a second doped semiconductor layer and an electrically conducting layer,
  etch the stack of layers, making first and second doped semiconductor portions forming a p-n junction for each diode, the second doped semiconductor portion comprising a first part located between a second part of the second doped semiconductor portion and the first doped semiconductor portion and forming an offset on only one side of the mesa structure from the second part of the second doped semiconductor portion, and making a first electrode electrically connected to the first doped semiconductor portion, make dielectric portions covering the side faces of the first doped semiconductor portion, the second doped semiconductor portion and the first electrode of each diode and such that the dielectric portions at the sides of the mesa structure of each diode that do not form an offset are continuous along the entire height of the mesa structure, deposit of at least one electrically conducting material between the mesa structure of diodes and in contact with an upper face of the second part of the second doped semiconductor portion of each diode, planarization of the electrically conducting material stopping on the first electrode, for each diode forming a second electrode electrically connected to the second doped semiconductor portion and such that the upper faces of the first electrode, the second electrode and the dielectric portions form an approximately plane continuous surface, make an electrical connection electrically connecting diodes in series such that the first electrode of one of the two diodes is electrically connected to the second electrode of the other of the two diodes, and in which the second electrode of said other of the two diodes is in contact with one of the dielectric portions of said one of the two diodes covering one of the sides of the mesa structure not forming the offset.

Since the dielectric portions are deposited on the side faces of the mesa structure etched in the stack of layers, these dielectric portions may be made by a self-aligned process in order to insulate the electrodes of the diode without making use a stencil specially adapted to make these dielectric portions, for example using a conforming deposition of the material of dielectric portions and then etching portions of this material that do not cover the side faces of the mesa structure.

Furthermore, making the second electrode makes use of a "damascene" type process in which the electrically conducting material is formed by solid plate deposition, the second electrode then being obtained later by planarization of this electrically conducting material. Therefore making the second electrode does not require a specific alignment step or a particular masking step. The position of the second electrode may correspond to a space formed between the dielectric portions covering the side faces of two adjacent mesa structures.

The stack of layers may be etched using a stencil placed on the stack of layers and comprising a first part with a thickness greater than the thickness of a second part of the stencil deposited facing the upper face of the second part of the second doped semiconductor portion that will be in contact with the second electrode, facing the first part of the second doped semiconductor portion.

The steps used may form diodes of mesa structure for which the upper faces of first electrodes, the second electrodes and dielectric portions together form the approximately plane continuous surface.

The electrically conducting material may be deposited between the mesa structure of diodes and in contact with the dielectric portions of said diodes.

The method may also include a step after the planarization step of the electrically conducting material to make a diode connection structure on the upper faces of the first electrodes, the second electrodes and dielectric portions, the connection structure comprising at least electrically conducting elements electrically connected to the first and/or second electrodes of the diodes, and electrically insulated from each other by dielectric elements.

BRIEF DESCRIPTION OF THE DRAWINGS

This invention will be better understood after reading the description of example embodiments given purely for guidance and that is in no way limitative with reference to the appended drawings in which.

Identical, similar or equivalent parts of the different figures described below have the same numeric references in order to make it easier to compare the different figures.

The different parts shown in the figures are not necessarily at a uniform scale, to make the figures more easily readable.

The different possibilities (variants and embodiments) must be understood as not being exclusive of each other and they can be combined with each other.

DETAILED PRESENTATION OF PARTICULAR EMBODIMENTS

Figure 1:
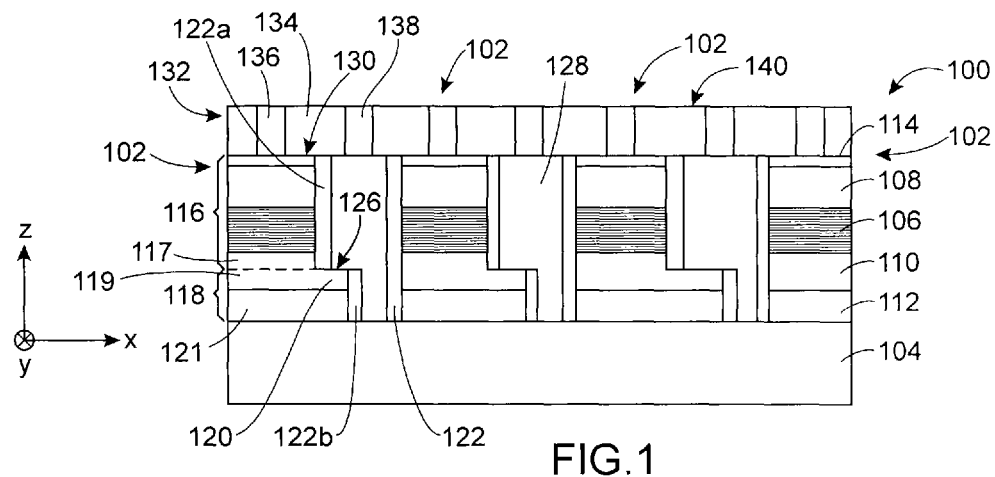
FIGS. 1 and 2 show an electronic device comprising several mesa structure diodes according to a first embodiment.

Refer firstly to FIG. 1 that shows an electronic device 100 comprising several diodes 102 each with a mesa structure and according to a first embodiment. In this first embodiment, the diodes 102 are LEDs and the device 100 corresponds to a LED light fitting such as a LED bulb.

The microelectronic device 100 comprises a substrate 104, for example made of sapphire, that acts as a support for the deposition or growth of the layers intended for making diodes 102. In the first embodiment disclosed herein, the diodes 102 are arranged adjacent to each other forming a diode matrix 102, in other words with diodes with a uniform spacing between each other. As a variant, the diodes 102 may be made adjacent to each other without forming a diode matrix, without uniform spacing between them.

Each of the diodes 102 comprises an active emission zone 106. The active emission zones 106 are made from one or several emission layers, for example five layers, each forming a quantum well, for example comprising InGaN, and each being located between two barrier layers, for example comprising GaN. All layers of active emission zones 106, in other words the emission layer(s) and barrier layers comprise intrinsic semiconducting materials, in other words not intentionally doped (concentration of residual donors $n_{nid}$ for example equal to about $10^{17}$ donors/cm$^{-3}$, or between about $10^{15}$ and $10^{18}$ donors/cm$^3$). The thickness of the emission layer or of each emission layer may for example be equal to about 3 nm and more generally between about 0.5 nm and 10 nm and the thickness of each barrier layer may for example be between 1 nm and 25 nm.

The active emission zone 106 of each diode 102 is arranged between a first p-doped semiconductor portion 108 and a second n-doped semiconductor portion 110, the two doped semiconductor portions 108 and 110 forming the p-n junction of the diode 102. The semiconductor of portions 108 and 110 may for example be GaN. The first portion 108 is p-doped with a concentration of acceptors between for example about $10^{17}$ and $5 \times 10^{19}$ acceptors/cm$^3$, and for example equal to about $5 \times 10^{18}$ acceptors/cm$^3$. The second portion 110 is n-doped with a concentration of donors between for example about $10^{17}$ and $5 \times 10^{19}$ donors/cm$^3$, and for example equal to about $1 \times 10^{19}$ donors/cm$^3$. The two portions 108 and 110 may each be between about 20 nm and 10 μm thick.

In one variant embodiment, an electron blocking layer (not visible in FIG. 1) may be placed between the first p-doped semiconductor portion 108 and the active emission zone 106, this electron blocking layer being made for example of AlGaN with 12% aluminum and p-doped with a concentration of acceptors for example equal to about $1 \times 10^{17}$ acceptors/cm$^3$. There is a buffer layer 112 between the second portion 110 and the substrate 104. This buffer layer 112 may for example be composed of n-doped GaN and its thickness is usually more than about 100 nm, for example of the order of one micron. Such a buffer layer 112 is particularly useful for filtering growth defects such that these defects are not located in p-n junctions of the diodes 102.

Materials other than those mentioned above can be used to make the diodes 102.

Each diode 102 also comprises a first electrode 114 comprising an electrically conducting material and located on the first portion of p-doped semiconductor 108 and electrically connected to it, in this case forming an anode of the diode 102.

The diodes 102 are for example made by etching a stack formed from different layers of materials described above and forming mesa structures of the diodes 102, in other words stacks in the form of islands. Each mesa structure comprises an upper part 116 formed from portions 114, 108 and 106 and a first part 117 of the second doped semiconductor portion 110, and a lower part 118 composed of a second part 119 of the second doped semiconductor portion 110 and a part 121 of the buffer layer. The upper parts 116 and the lower parts 118 of the mesa structures may each have a rectangular section in a plane parallel to the (X,Y) plane shown in FIG. 1 (this (X,Y) plane being parallel to the plane in which the interface between the two parts 117 and 119 of the second doped semiconductor portion 110 is located, and also parallel to the surface of the substrate 104 on which the diodes 102 are made).

Furthermore, the width of the lower part 118, in other words the dimension of the section of the lower part 118 along the X-axis shown in FIG. 1, is greater than the dimension of the upper part 116. The length of the lower part 118, in other words the dimension of the section of the upper part 116 along the Y-axis shown in FIG. 1, is also equal to the length of the upper part 116. Therefore the mesa structure of diodes 102 is "L-shaped" in this case. Therefore the first part 117 of the second doped semiconductor portion 110 forms an offset relative to the second part 119 of the second doped semiconductor portion 110.

Thus, on one side of the mesa structure of each diode 102, a portion 120 of the second part 119 of the second doped semiconductor portion 110 is not covered by the first part 117 of the second doped semiconductor portion 110. An upper face 126 of the second part 119 of the second doped semiconductor portion 110 is therefore electrically accessible.

Each diode 102 also comprises dielectric portions 122 covering the side faces of the mesa structures, in other words the side faces of the first electrodes 114, the first portions of doped semiconductor 108, active emission zones 106, second portions of doped semiconductor 110 and portions 121 of the buffer layer 112. On the sides of the mesa structure that have no offset, the dielectric portions 112 that cover the side faces of the structure are continuous along the entire height of the mesa structure, from the upper face of the substrate 104 as far as the upper face of the first electrode 114. On the other hand, on the side of the mesa structure on which there is an offset, a first part 122a of the dielectric portion 122 covers the side faces of the upper part 116, and a second part 122b of the dielectric portion 122 also covers the side faces of the lower part 118, these two parts 122a and 122b of the dielectric portion 122 being discontinuous with each other. The dielectric portions 122 electrically insulate and passivate the side faces of the junctions of diodes 102.

The thickness of the first part 122a of the dielectric portion 122 (that corresponds to the dimension along the X-axis in FIG. 1, and therefore parallel to the width of parts 116 and 118) is chosen such that it only partially covers the upper face 126 of the second part 119 of the second n-doped portion 110 that is accessible. For example, the portion 120 may have a width (dimension along the X-axis) at the offset formed between the parts 117 and 119 of the second doped semiconductor portion 110, equal to at least about 1% of the width of the upper part 116. For example, for an upper part 116 with a width equal to about 80 μm, the width of the portion 120 may be equal to about 5 μm.

The dimensions of the sides of the mesa structure may be between about 500 nm and 1 mm, or between 500 nm and several millimeters depending on the target applications, these dimensions concerning the upper part 116 and the lower part 118 of the mesa structure (with a difference of at least 1% between the two parts 116 and 118). For applications making use of high power diodes (for example LED bulbs to form car headlights), the dimensions of the diodes 102 will be greater than for applications making use of lower power diodes 102.

The space between two diodes 102 is filled with an electrically conducting material forming the second electrodes 128 between the diodes 102. Each of the second electrodes 128 is supported on the substrate 104 and is electrically in contact with the upper face 126 of the second part 119 of the second n-doped portion 110 of one of the diodes 102. Thus, each of the second electrodes 128 is electrically connected to a second portion of doped semiconductor 110 of one of the diodes 102 and in this case forms a cathode of this diode 102.

The width of a second electrode 128, in other words the dimension of the second electrode 128 between two mesa structures of diodes 102 (dimension parallel to the X-axis shown in FIG. 1) is sized as a function of acceptable losses related to carrying the electrical current. For example, this width may be between about 100 nm and several millimeters or more. For example, the length of the second electrode 102 (dimension parallel to the Y-axis shown in FIG. 1) is equal to the length of the mesa structures of the diodes 102.

Each of the second electrodes 128 has a section in the (X,Y) plane with a shape similar to the section of patterns etched in the stack of layers. Thus, each of the second electrodes 128 comprises a section in the (X,Y) plane for which the dimensions parallel to the X-axis at the part of the second electrode 128 in contact with the first part 122a of the dielectric portion 122b are less than the dimensions of the part of the second electrode 128 in contact with the second part 122b of the dielectric portion 122.

Due to the vertical dielectric portions 122, the second electrodes 128 are electrically well insulated from the first electrodes 114, the first semiconductor portions 108 and active emission zones 106. The thickness of the dielectric portions 122 is chosen particularly as a function of the dielectric constant of the material forming these dielectric portions 122 and may be chosen such that leakage current in each of the diodes 102 in these portions 122 is acceptable, for example less than about 1% of the nominal current passing through the diode 102 when a potential difference is applied to them (between the cathode and the anode surrounding each of these portions 122), for example of the order of 4V. The minimum thickness of the dielectric portions 122 is for example between about 3 nm and 5 nm, or between 3 nm and 4 nm, depending on the material used to make the dielectric portions 122.

Considering the mesa structures formed by the diodes 102 and the geometry of the second electrodes 128, the upper faces of the first electrodes 114, the dielectric portions 122 and the second electrodes 128 together form an approximately plane surface 130, in other words they are all located in approximately the same plane. Since the planarization step of the material of the second electrodes 128 used for manufacturing the device 100 (step described below with relation to the manufacturing process), the upper faces of the first electrodes 114 and the upper faces of the second electrodes 128 may have recesses with depths (relative to the upper face of the dielectric portions 122) between about 5 nm and 150 nm. However, these recesses have the advantage that they guarantee electrical insulation between the electrodes 114 and 128 made by the dielectric portions 122.

The device 100 also comprises a connection structure 132 forming electrical connections for the diodes 102, on the surface 130. In the first embodiment shown in FIG. 1, this connection structure 132 comprises first electrically conducting elements 136 electrically connected to the first electrodes 114 of the diodes 102 and second electrically conducting elements 138 electrically connected to the second electrodes 128 of the diodes 102. The electrically conducting elements 136, 138 are electrically insulated from each other by dielectric elements 134 for which the dimensions in the (X,Y) plane are at least equal to the dimensions of the dielectric portions 122 so that the electrically conducting elements 136 and 138 do not form short circuits between the electrodes of the diodes 102. The thickness of the connection structure 132 (dimension along the Z-axis shown in FIG. 1) may for example be greater than or equal to about 20 nm.

In this first embodiment, the electrically conducting elements 136 and 138 are not electrically connected to each other, the anode and the cathode of each of the diodes 102 being accessible independently of each other through electrically conducting elements 136 and 138. The diodes 102 can thus form a generic diode matrix from which any type of electrical connection of the diodes 102 is possible. Furthermore, an upper surface 140 of the connection structure 132 is plane and therefore can be hybridized directly with another element, for example a substrate comprising a driver for controlling and for appropriate addressing of diodes 102 so that electrical connections (putting in series, in parallel, etc.) of the diodes 102 can be managed, for example so as to follow the power supply voltage of the device 100.

Figure 2:
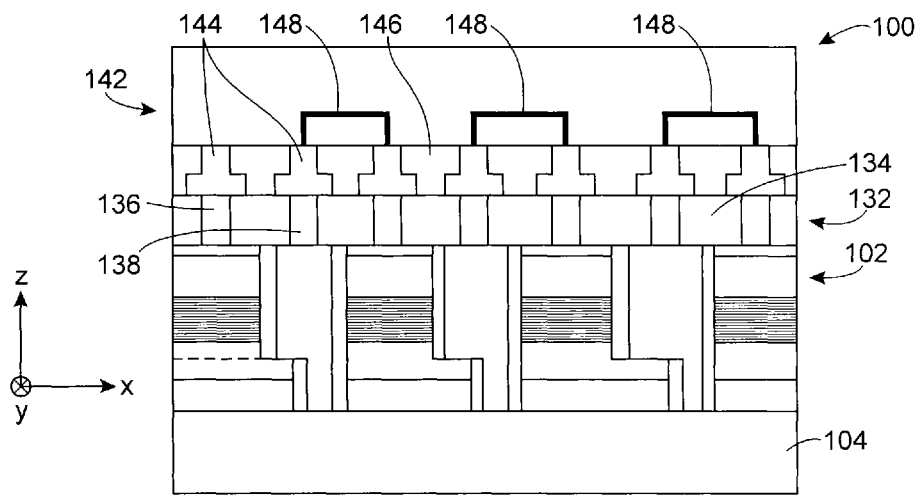

FIG. 2 shows the device 100 according to the first embodiment and comprising a substrate 142 like that described above and hybridized on the upper face 140 of the connection structure 132. This substrate 142 comprises electrical connection pads 144 at the interface with the upper face 140, electrically in contact with electrically conducting elements 136 and 138, these electrical connection pads 144 being electrically insulated from each other by a dielectric material 146 in contact with the dielectric elements 134. This substrate 142 also comprises control electronics not shown in FIG. 2, for managing interconnections between the electrical connection pads 144. In FIG. 2, the interconnections 148 are configured to put at least some of the diodes 102 of the device 100 into series. In this case, the substrate 142 is solidarised to the connection structure 132 by direct metal-metal bonding between the electrical connection pads 144 and the electrically conducting elements 136, 138 and by direct dielectric-dielectric bonding between the dielectric material 146 and the dielectric elements 134.

In the first embodiment described herein, the electronic device 100 is a lighting device with LEDs, the diodes 102 corresponding to LEDs. As a variant, the electronic device 100 may comprise diodes 102 corresponding to photo-receiving diodes or photodiodes. In this case, the element reference 106 of each diode 102 placed between semiconducting portions 108 and 110 that are p-doped and n-doped respectively may correspond to an intrinsic semiconductor portion. Furthermore in this variant, the anodes 114 and the cathodes 128 of diodes 102 cannot be used to output a power supply current to the diodes 102 but are used to recover currents photo-generated by the diodes 102.

According to another variant, regardless of whether the diodes 102 are used as LEDs or photodiodes, the mesa structures of the diodes 102 do not necessarily comprise any emission zones 106 or intrinsic semiconductor portions, and the first p-doped semiconductor portions 108 are then placed directly on the second n-doped semiconducting portions 110. The other elements of such an electronic device are similar to the elements of the electronic device 100 described above.

In the first embodiment described above, the mesa structures of diodes 102 comprise rectangular-shaped sections. As a variant, the diodes 102 may be made by forming mesa structures with a section with a shape other than rectangular, for example it may be circular, triangular, etc. In all cases, a recess is formed at an interface between two parts of the second doped portion 110 in order to form an electrical access to this second doped semiconductor portion 110 for the second electrode 128.

Figure 3:
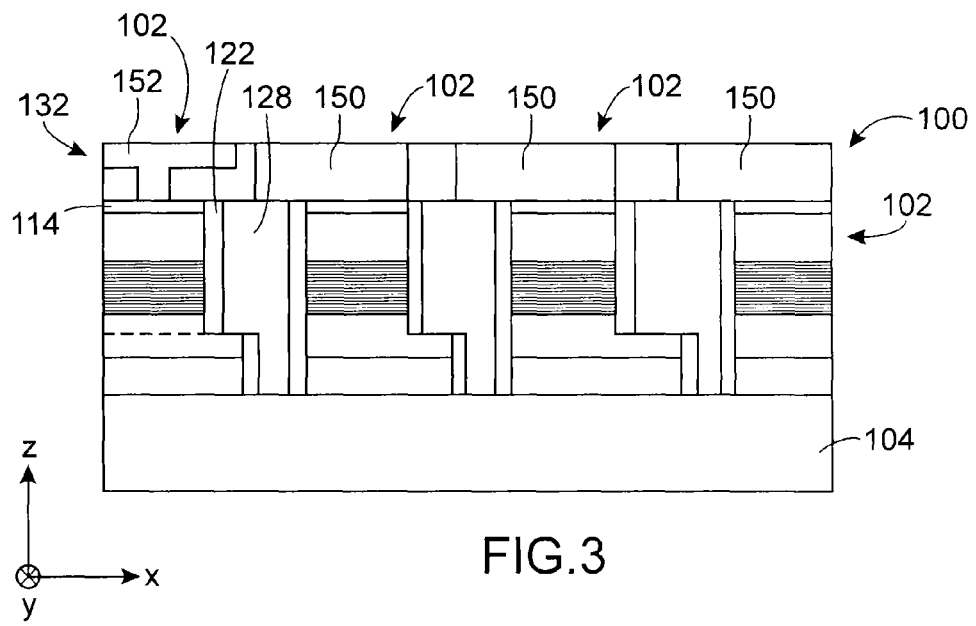
FIG. 3 shows an electronic device comprising several mesa structure diodes according to a second embodiment.

FIG. 3 shows the electronic device 100 according to a second embodiment.

As in the first embodiment, the device 100 comprises the substrate 104 on which the mesa structure diodes 102 are formed comprising electrodes 114 and 128 and dielectric portions 122. The device 100 also comprises the connection structure 132. On the other hand, the electrically conducting elements of this connection structure 132 are different from those described above in the first embodiment. Each of the electrically conducting elements 150 of this connection structure 132 connects the cathode 128 of a first diode 102 to the anode 114 of a second diode 102 adjacent to the first. Thus, each electrical connection element 150 forms an electrical connection connecting two adjacent diodes in series.

The connection structure 132 also comprises two other electrically conducting elements 152 (only one of which is shown in FIG. 3) that do not connect the two diodes 102 in series but that form electrical access pads to the diodes 102 from the cathode or the anode of one of the diodes 102. For example, it is possible to have two access pads 152 forming electrical contacts of two ends of a set of diodes 102 connected to each other in series, one of the two ends being formed by the anode of a first diode 102 and the other end being formed by the cathode of a last diode 102, these two access pads electrically supplying power to the diodes 102 through the connection of an external driver to these two pads, such a driver for example regulating the current in the device 100 starting from a direct connection on the mains power supply.

Figure 4:
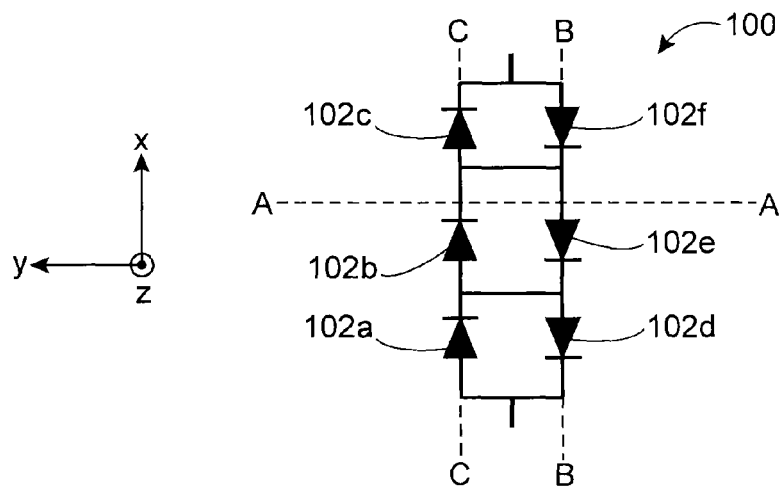
FIGS. 4 and 5A to 5C show another example embodiment of an electronic device comprising several mesa structure diodes according to the second embodiment.

FIG. 4 diagrammatically shows an example embodiment of the device 100 according to the second embodiment, forming a module composed of six LEDs 102.

The device 100 comprises three LEDs 102a, 102b and 102c electrically connected to each other in series, and three other LEDs 102d, 102e and 102f electrically connected to each other in series and arranged head-foot to the three LEDs 102a, 102b and 102c. The cathode of LED 102a that is electrically connected to the anode of LED 102b is also electrically connected to the anode of LED 102d and to the cathode of LED 102e. The cathode of LED 102b that is electrically connected to the anode of LED 102c is also electrically connected to the anode of LED 102e and to the cathode of LED 102f. Furthermore, the cathode of LED 102c is electrically connected to the anode of LED 102f, and the anode of LED 102a is electrically connected to the cathode of LED 102d. The device 100 is electrically powered by applying a power supply voltage between two terminals, one being electrically connected to the cathode of LED 102c (and therefore also to the anode of LED 102f) and the other being electrically connected to the anode of LED 102a (and therefore also to the cathode of LED 102d).

Since the LEDs are connected in series three by three between the two power supply terminals of the device 100, the operating voltage of the device 100 is about 9V (the operating voltage of each LED being about 3V). Furthermore, since the LEDs 102a, 102b and 102c are arranged head-foot relative to LEDs 102d, 102e and 102f, the device 100 is adapted to be electrically powered by an alternating voltage.

Figure 5A:
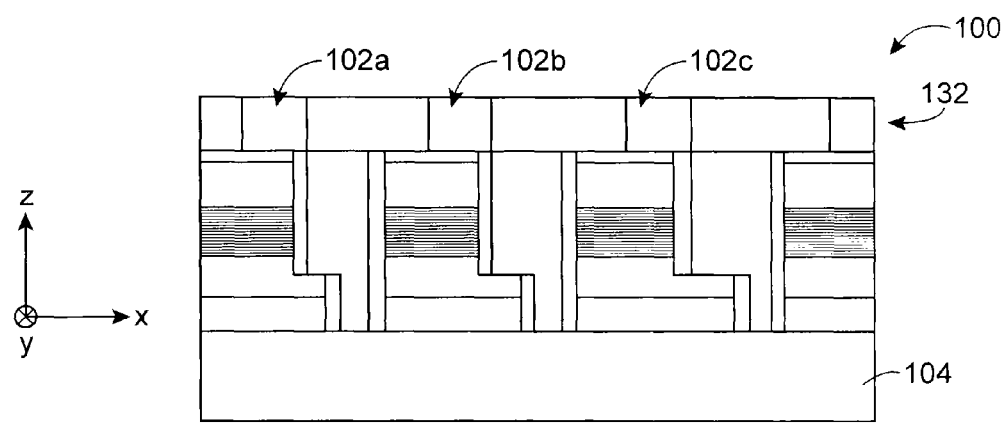
Figure 5B:
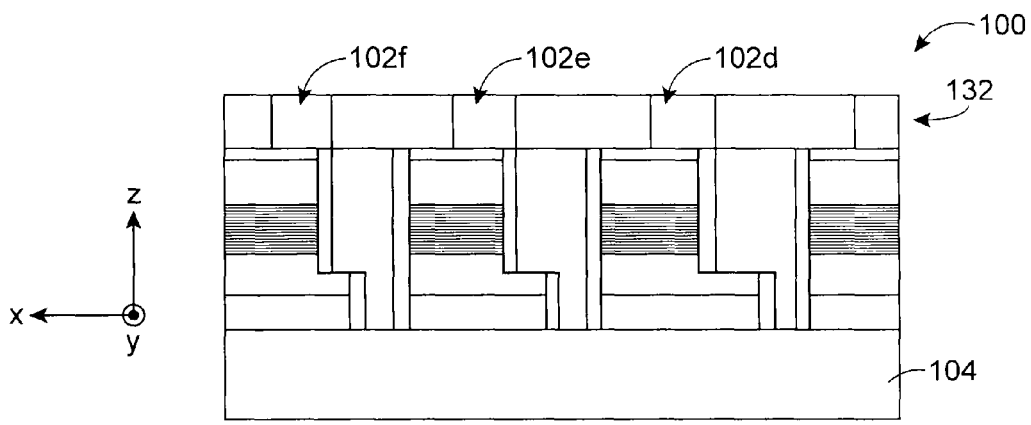

FIG. 5A shows a sectional view of the device 100 along the CC axis shown in FIG. 4, in other words along the three LEDs 102a, 102b and 102c connected to each other in series. FIG. 5B shows a sectional view of the device 100 along the BB axis shown in FIG. 4, in other words along the three LEDs 102d, 102e and 102f connected to each other in series. The elements shown in FIGS. 5A and 5B correspond to elements described above with reference to FIG. 3.

Figure 5C:
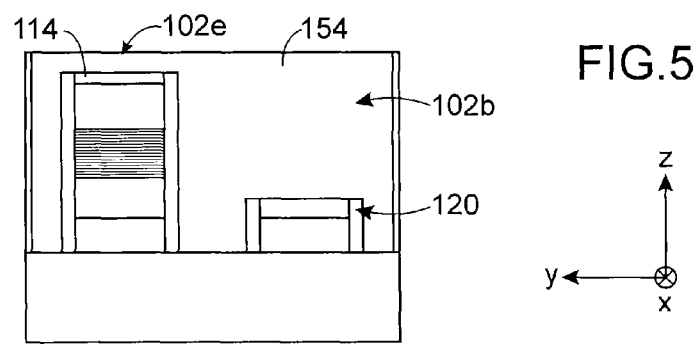

FIG. 5C shows a sectional view of the device 100 along the AA axis shown in FIG. 4, in other words with a cross-section through LEDs 102b and 102e. This figure also shows that in this case the electrically conducting material 154 connects the anode of LED 102e to the cathode of LED 102b that is in contact with the portion 120 of the mesa structure of the LED 102b, at the upper face 126 of the second part 119 of the second doped semiconductor portion 110 of LED 102b.

In the example described in FIGS. 4 and 5A-5C, the electrical connection between the cathode of LED 102a and the anode of LED 102d and the electrical connection between the cathode of LED 102b and the anode of LED 102e are such that if one of the LEDs fails, this failure will not cause an open circuit and global failure of the device 100.

As a variant, the device 100 in FIG. 4 could comprise a variable number of LEDs connected to each other in series. It is also possible to form a device 100 powered by a continuous power supply voltage by making the device 100 starting from a single set of LEDs connected to each other in series, the power supply voltage in this case being applied between a first terminal corresponding to the anode of the first LED and a second terminal corresponding to the cathode of the last LED.

According to another variant, it is also possible that the device 100 comprises one or several other LEDs in order to make the six LEDs 102a-102f redundant. Thus, the device 100 could comprise three other LEDs 102 connected to each other in series, this set of three LEDs being connected in parallel to the three LEDs 102a to 102c to make the three LEDs 102a-102c redundant. A similar redundancy can be achieved for the three LEDs 102d to 102f with three other LEDs.

A method for making the device 100 is disclosed with reference to FIGS. 6A to 6K.

Figure 6A:
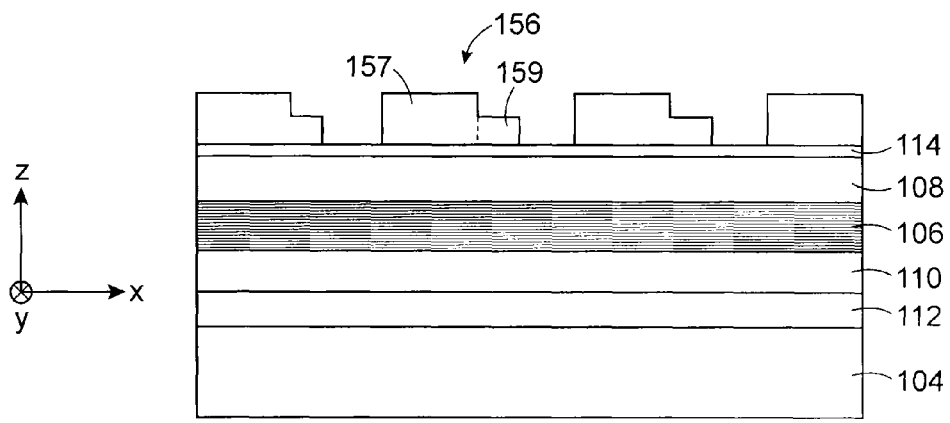
FIGS. 6A to 6K show the steps in a method of making an electronic device according to a particular embodiment.

A stack of the different layers that will form elements 112, 110, 106, 108 and 114 of the diodes 102 is firstly made on the substrate 104. A hard stencil 156 is also made at the top of this stack of layers. The pattern for this hard stencil 156 corresponds to the pattern for the mesa structures of diodes 102 that will be made by etching in the stack of layers (FIG. 6A). Thus, this stencil 156 comprises a first part 157 thicker than the second part 159 of the stencil arranged facing the upper face 126 of the second part 119 of the second doped semiconductor portion 110 that will come into contact with the second electrode 128 that will be formed, facing the first part 117 of the second doped semiconductor portion 110 that will be formed. The thicknesses of these two parts 157, 159 of the stencil 156 are chosen as a function of the rate at which the different materials in the stack of layers will be etched.

Figure 6B:
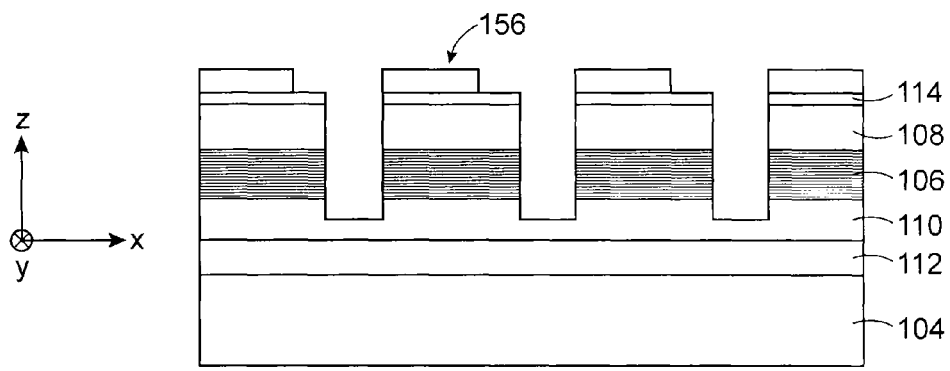
Figure 6C:
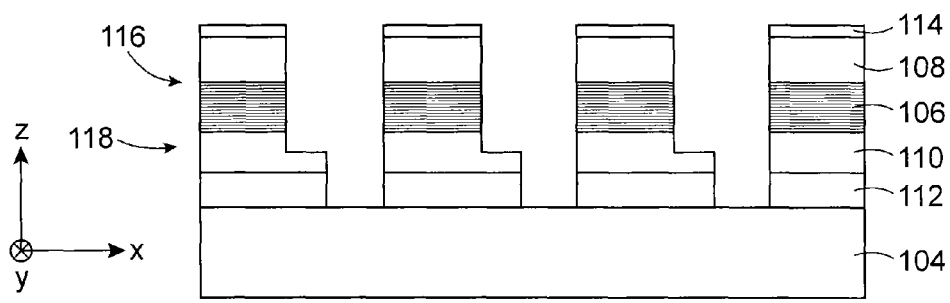

As shown in FIG. 6B, the stack of layers is etched down to a depth located in the n-doped semiconductor layer that will be used to form the portions 110. This etching "consumes" the stencil 156 over a thickness equal to the thickness of the second part 159. This etching defines part of the spaces in which the second electrodes 128 will be made, in the stack of layers. This etching is then continued through parts of the stack not covered by the remaining portions of the hard stencil 156, so that the formation of the upper parts 116 of the mesa structures can be completed and the lower parts 118 of the mesa structures can also be formed (FIG. 6C).

Figure 6D:
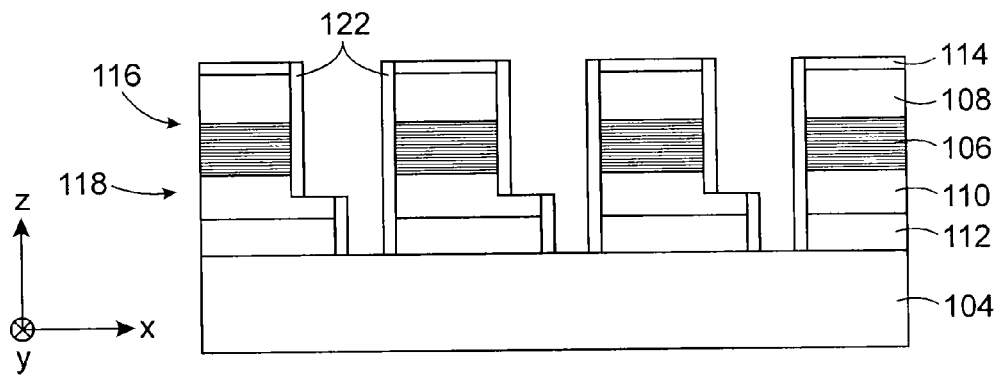

Any remaining portions of the hard stencil 156 are then eliminated, and the dielectric portions 122 are then made on the side faces of the mesa structures previously etched in the stack of layers (FIG. 6D). For example, the dielectric portions 122 are made by a PECVD (plasma enhanced chemical vapor deposition) or ALD (atomic layer deposition) type deposition, depending on the deposited material. This deposition of dielectric material is made on the side faces of the mesa structures, and also on and between the mesa structures. Only the portions of this deposit covering the side faces are kept by etching after the deposition, for example with RIE (reactive ionic etching) of parts of the dielectric material deposited on and between the mesa structures.

Figure 6E:
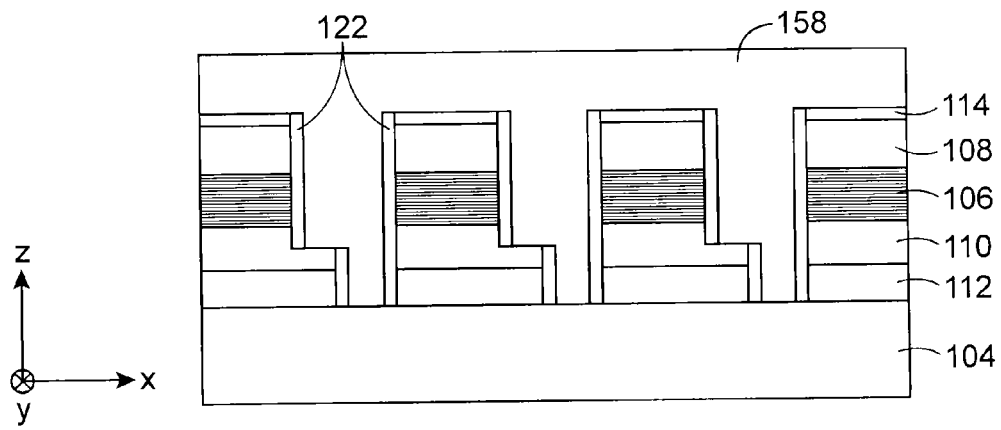

As shown in FIG. 6E, a solid plate deposition of an electrically conducting material 158 is then used such that the spaces between the mesa structures of the diodes 102 are filled with this electrically conducting material. The deposited electrically conducting material also covers the mesa structures, due to the solid plate deposition made.

Figure 6F:
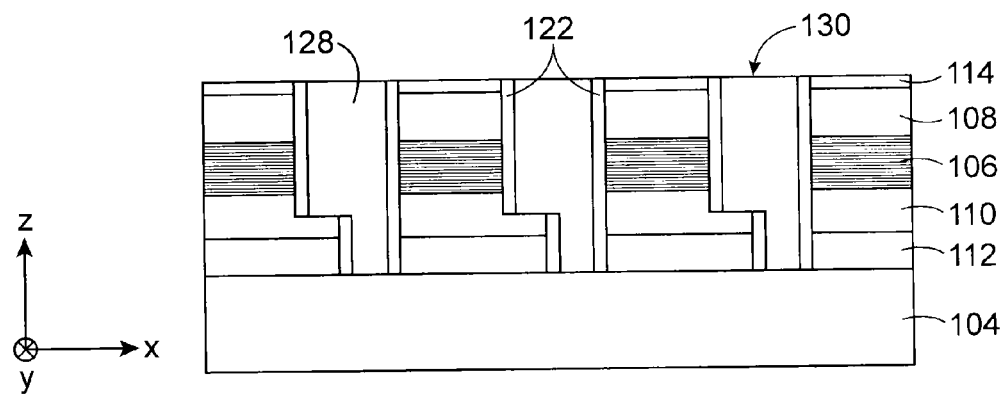

A chemical mechanical planarization is then applied stopping at the upper faces of the dielectric portions 122 in order to eliminate parts of the electrically conducting material 158 covering the mesa structures. The remaining electrically conducting material forms the second electrodes 128, in other words the cathodes of the diodes 102 (FIG. 6F). Since the abrasion rate of the metal forming the electrodes 114 and 128 is higher than the abrasion rate of the dielectric material of portions 122, this CMP step may form slight recesses at electrodes 114 and 128 relative to the upper faces of the dielectric portions 122, as described above. However, the upper face obtained remains approximately plane and suitable for subsequent hybridizing, for example by direct bonding.

Figure 6G:
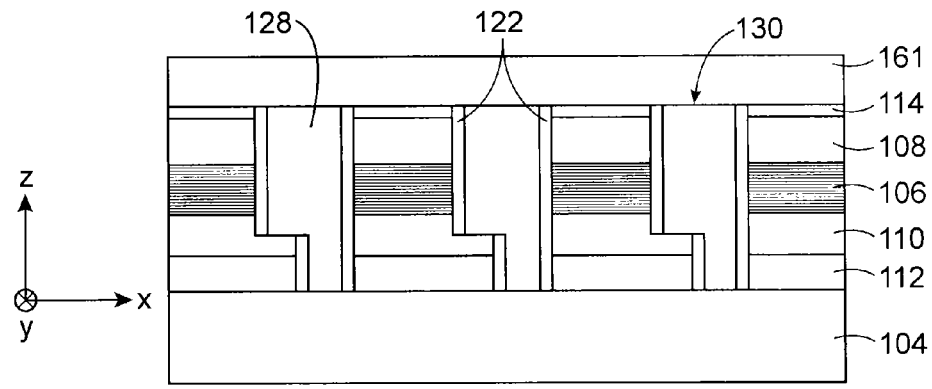
Figure 6H:
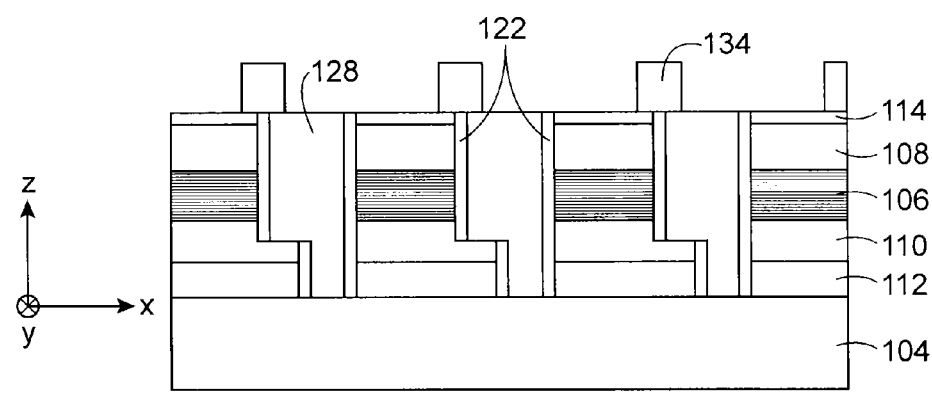

As shown in FIG. 6G, a dielectric layer 161 is then deposited on the previously made assembly. Lithography and etching are then done in order to define dielectric elements 134 of the future connection structure 132, and cavities between these dielectric elements 134 defining the positions of the future electrically conducting elements of the connection structure 132 (FIG. 6H). The pattern of this lithography is chosen particularly as a function of electrical connections required for the diodes 102 (putting in series, individual connections of each electrode, etc.).

Figure 6I:
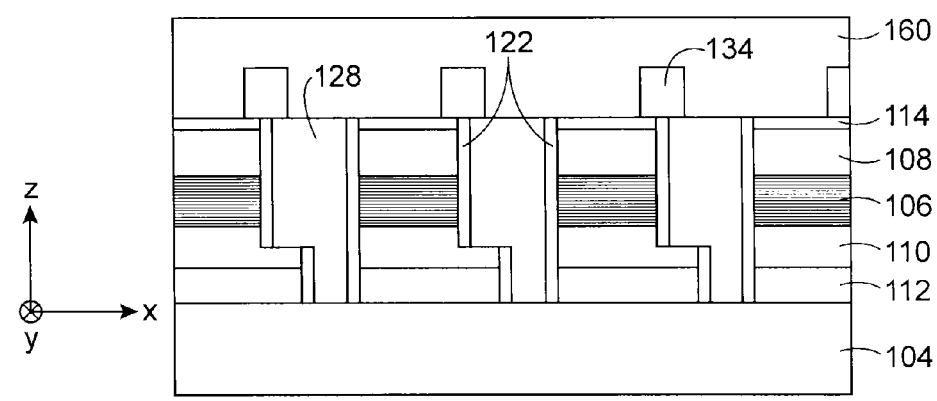
Figure 6J:
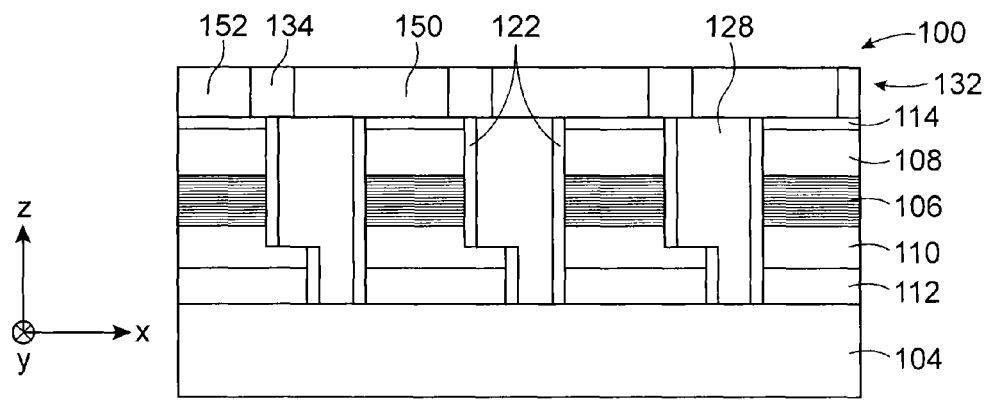

Another solid plate deposition of at least one electrically conducting material 160 is made (FIG. 6I). This deposition of electrically conducting material may for example correspond to application of a first titanium deposition with a thickness of about 10 nm, and then a second aluminum deposition with a thickness of about 3 μm. In particular, this or these electrically conducting materials fill in the spaces between the dielectric elements 134.

Chemical mechanical planarization is then done stopping on the dielectric elements 134, thus defining electrically conducting elements 150 connected to the anodes and to the cathodes of the diodes 102, and electrically conducting elements 152 forming contact pads of the connection structure 132. In the example in FIG. 6J, the electrically conducting elements connect the diodes 102 in series. The electronic device 100 thus obtained corresponds to that described previously with reference to FIG. 2.

Figure 6K:
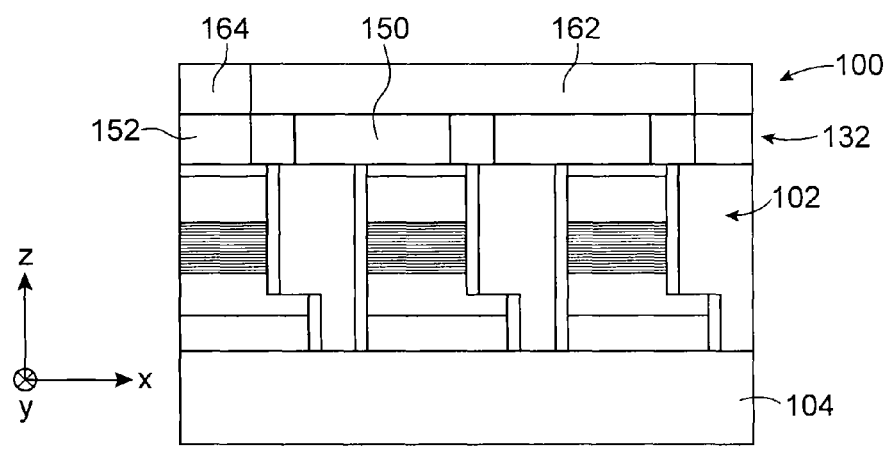

As shown in FIG. 6K, the connection structure 132 can be completed by making a dielectric deposition 162 covering the electrically conducting elements 150, followed by etching of this dielectric at the electrically conducting elements 152 that will form access pads of the device 100, then by depositing a metal to extend these access pads adjacent to the dielectric deposition 162. Thus, the electrically conducting elements 150 forming connections between the diodes 102 of the device 100 are not accessible from outside the device 100. All that is accessible from outside the device 100 are the electrical contact pads 164.

The invention claimed is:

1. An electronic device comprising at least two diodes, each diode having a mesa structure, comprising:
    a first and a second doped semiconductor portion forming a p-n junction, such that a first part of the second doped semiconductor portion located between a second part of the second doped semiconductor portion and the first doped semiconductor portion forms an offset from the second part of the second doped semiconductor portion;
    a first electrode electrically connected to the first doped semiconductor portion, and a second electrode electrically connected to the second doped semiconductor portion at an upper face of the second part of the second doped semiconductor portion; and
    dielectric portions covering side faces of the first doped semiconductor portion, the second doped semiconductor portion, and the first electrode such that dielectric portions at sides of the mesa structure of said diode that do not form an offset are continuous along an entire height of the mesa structure,
    wherein upper faces of the first electrode, the second electrode, and the dielectric portions form an approximately plane continuous surface,
    wherein the at least two diodes are electrically connected in series such that the first electrode of one of the at least two diodes is electrically connected to the second electrode of the other of the two diodes, and
    wherein the second electrode of said other of the at least two diodes is in contact with one of the dielectric portions of said one of the at least two diodes covering one of the sides of the mesa structure that does not form the offset.

2. The electronic device according to claim 1, wherein the first electrode, the first doped semiconductor portion, the first part of the second doped semiconductor portion, and the second part of the second doped semiconductor portion of said each diode each have a section in a plane parallel to an interface between the first and the second parts of the second doped semiconductor portion, with a rectangular shape.

3. The electronic device according to claim 2, wherein for said each diode, a dimension of one side of the section of the second part of the second doped semiconductor portion is greater than a dimension of the section of the first part of the second doped semiconductor portion parallel to said side of the section of the second part of the second doped semiconductor portion.

4. The electronic device according to claim 1, wherein said each diode is a photodiode or a LED.

5. The electronic device according to claim 4, wherein the photodiode comprises at least one portion of intrinsic semiconductor arranged between the first and second doped semiconductor portions such that side faces of the intrinsic semiconductor portion are covered by the dielectric portions, or wherein the LED comprises at least one active emission zone with at least one quantum well arranged between the first and the second doped semiconductor portions and such that side faces of the active emission zone are covered by the dielectric portions.

6. The electronic device according to claim 1, wherein the upper faces of the first electrodes, the second electrodes, and the dielectric portions of said diodes together form the approximately plane continuous surface.

7. The electronic device according to claim 1, further comprising a diode connection structure located on the upper faces of the first electrodes, the second electrodes, and the dielectric portions, the connection structure comprising at least electrically conducting elements electrically connected to the first and/or second electrodes of the diodes and electrically insulated from each other by dielectric elements.

8. The electronic device according to claim 7, wherein an upper face of the connection structure forms a plane continuous surface.

9. The electronic device according to claim 7, wherein at least some of the diodes are electrically connected to each other in series by at least some of the electrically conducting elements of the connection structure, each of said electrically conducting elements electrically connecting a second electrode of one of said diodes to a first electrode of the other of said diodes.

10. The electronic device according to claim 7, wherein each electrically conducting element in the connection structure forms a connection pad electrically connected to a single electrode of one of the diodes, the electronic device further comprising a substrate hybridized onto the connection structure and comprising means capable of forming electrical connections between the electrically conducting elements of the connection structure.

* * * * *